(12) United States Patent
Banno et al.

(10) Patent No.: US 11,476,017 B2
(45) Date of Patent: Oct. 18, 2022

(54) METHOD FOR PRODUCING NB3SN SUPERCONDUCTING WIRE, PRECURSOR FOR NB3SN SUPERCONDUCTING WIRE, AND NB3SN SUPERCONDUCTING WIRE USING SAME

(71) Applicant: NATIONAL INSTITUTE FOR MATERIALS SCIENCE, Ibaraki (JP)

(72) Inventors: Nobuya Banno, Ibaraki (JP); Kyoji Tachikawa, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 575 days.

(21) Appl. No.: 16/494,378

(22) PCT Filed: Feb. 26, 2018

(86) PCT No.: PCT/JP2018/006899
§ 371 (c)(1),
(2) Date: Sep. 16, 2019

(87) PCT Pub. No.: WO2018/198515
PCT Pub. Date: Nov. 1, 2018

(65) Prior Publication Data
US 2020/0020463 A1    Jan. 16, 2020

(30) Foreign Application Priority Data

Apr. 27, 2017  (JP) .............................. JP2017-087851
Sep. 6, 2017   (JP) .............................. JP2017-170827

(51) Int. Cl.
*H01B 12/10*    (2006.01)
*C22C 9/01*     (2006.01)
(Continued)

(52) U.S. Cl.
CPC .............. *H01B 12/10* (2013.01); *C22C 9/00* (2013.01); *C22C 9/01* (2013.01); *C22C 9/04* (2013.01);
(Continued)

(58) Field of Classification Search
None
See application file for complete search history.

(56) References Cited

U.S. PATENT DOCUMENTS 5,837,941 A * 11/1998 Tachikawa .............. H01L 39/14
                                                      505/887
2002/0006527 A1 * 1/2002 Kubo .................. H01L 39/2409
                                                      428/662

FOREIGN PATENT DOCUMENTS

JP     54-40438       3/1979
JP     2009-193856    8/2009
(Continued)

OTHER PUBLICATIONS

International Search Report dated Apr. 10, 2018 in International Application No. PCT/JP2018/006899.
(Continued)

*Primary Examiner* — Xiaobei Wang
(74) *Attorney, Agent, or Firm* — Wenderoth, Lind & Ponack, L.L.P.

(57) ABSTRACT

In the production of an internal-tin-processed $Nb_3Sn$ superconducting wire, the present invention provides a $Nb_3Sn$ superconducting wire that is abundant in functionality, such as, the promotion of formation of a $Nb_3Sn$ layer, the mechanical strength of the superconducting filament (and an increase in interface resistance), the higher critical temperature (magnetic field), and the grain size reduction, and a method for producing it. A method for producing a $Nb_3Sn$ superconducting wire according to an embodiment of the present invention includes a step of providing a bar 10 that
(Continued)

has a Sn insertion hole 12 provided in a central portion of the bar 10 and a plurality of Nb insertion holes 14 provided discretely along an outer peripheral surface of the Sn insertion hole 12, and that has an alloy composition being Cu-xZn-yM (x: 0.1 to 40 mass %, M=Ge, Ga, Mg, or Al, provided that, for Mg, x: 0 to 40 mass %), a step of mounting an alloy bar with an alloy composition of Sn-zQ (Q=Ti, Zr, or Hf) into the Sn insertion hole 12 and inserting Nb cores into the Nb insertion holes 14, a step of subjecting the bar 10 to diameter reduction processing to fabricate a Cu-xZn-yM/Nb/Sn-zQ composite multicore wire with a prescribed outer diameter, and a step of subjecting the composite multicore wire to $Nb_3Sn$ phase generation heat treatment.

7 Claims, 10 Drawing Sheets (51) Int. Cl.

| | | |
|---|---|---|
| | *C22C 9/04* | (2006.01) |
| | *C22C 13/00* | (2006.01) |
| | *C22C 27/02* | (2006.01) |
| | *C22F 1/08* | (2006.01) |
| | *C22C 9/00* | (2006.01) |
| | *C22F 1/18* | (2006.01) |
| | *H01L 39/24* | (2006.01) |
| | *C22F 1/16* | (2006.01) |

(52) U.S. Cl.
CPC .............. *C22C 13/00* (2013.01); *C22C 27/02* (2013.01); *C22F 1/08* (2013.01); *C22F 1/16* (2013.01); *C22F 1/18* (2013.01); *H01L 39/2409* (2013.01); *Y10T 428/12708* (2015.01); *Y10T 428/12819* (2015.01); *Y10T 428/12903* (2015.01)

(56) References Cited

FOREIGN PATENT DOCUMENTS

| | | |
|---|---|---|
| JP | 2013-206532 | 10/2013 |
| JP | 2015-185211 | 10/2015 |

OTHER PUBLICATIONS

Office Action dated Jul. 21, 2020 in corresponding Chinese Patent Application No. 201880027719.0, with English Translation.

* cited by examiner

METHOD FOR PRODUCING NB3SN SUPERCONDUCTING WIRE, PRECURSOR FOR NB3SN SUPERCONDUCTING WIRE, AND NB3SN SUPERCONDUCTING WIRE USING SAME

TECHNICAL FIELD

The present invention relates to a $Nb_3Sn$ superconducting wire, and relates particularly to a method for producing a $Nb_3Sn$ superconducting wire using an internal tin process. Further, the present invention relates to a precursor for a $Nb_3Sn$ superconducting wire suitable for use of the method for producing a $Nb_3Sn$ superconducting wire, and a $Nb_3Sn$ superconducting wire using the same.

BACKGROUND ART $Nb_3Sn$ (niobium 3 tin) is an intermetallic compound of niobium (Nb) and tin (Sn), and is processed into a wire to be used for superconducting magnets for nuclear fusion and nuclear magnetic resonance (NMR) apparatuses, etc.

$Nb_3Sn$ is more expensive than niobium titanium (NbTi); however, from the viewpoint of the critical magnetic field Hc, while NbTi has approximately 15 T, $Nb_3Sn$ has a magnetic field strength as high as approximately 30 T. $Nb_3Sn$ has a critical temperature of 18.3 kelvins (K), and is usually used at 4.2 K, that is, the boiling point temperature of liquid helium.

From a mechanical point of view, $Nb_3Sn$ as a superconducting wire is very brittle, and does not allow easy production of a wire necessary to wind a superconducting magnet. To overcome this, wire manufacturers perform diameter reduction processing typically using a composite wire containing a precursor having ductility. In the internal tin process, different alloys of Nb, Cu, and Sn are contained. In the bronze process, Nb is embedded in a bronze matrix of copper and tin. In both production processes, typically a wire is subjected to diameter reduction processing to the final wire diameter, and is wound as a solenoid or a cable before heat treatment. That is, it is only during heat treatment that Nb reacts with Sn and forms a brittle superconducting niobium 3 tin compound.

Next, the bronze process and the internal tin process, which are methods for producing a $Nb_3Sn$ superconducting wire as the precursor mentioned above, are described in detail.

Patent Literature 1 discloses a wire production technology based on what is called the bronze process using a Cu—Sn—Zn matrix and a Nb alloy core. The bronze process refers to a method in which a $Nb_3Sn$ phase is generated by diffusion reaction between Cu—Sn in which Sn is dissolved as solid solution in Cu or a bronze matrix in which a third element is further dissolved as solid solution, and a large number of Nb cores embedded therein. However, in this process, the solid solution ratio of Sn in the matrix is limited to less than or equal to 15.5 mass % in terms of the processability of the wire, and there has been a problem that it is difficult to increase the volume of $Nb_3Sn$, that is, to enhance the critical current density per cross section of the wire. Further, in the bronze process, large processing hardening of Cu—Sn alloy occurs during wiredrawing, and hence process annealing is indispensable; thus, there have been problems such as an increase in production cost because of this annealing.

On the other hand, the internal tin process refers to a method in which, without using Cu—Sn bronze, a precursor wire composed of pure Cu or a Cu alloy matrix in which an element other than Sn is dissolved as solid solution, and large numbers of Nb cores and Sn cores embedded therein is subjected to heat treatment to react Cu alloy and Sn together to once generate a Cu—Sn phase, subsequently the generated Cu—Sn phase and Nb make diffusion reaction, and thereby a $Nb_3Sn$ phase is generated. Patent Literatures 2 and 3 disclose examples of development of $Nb_3Sn$ superconducting wires by the internal tin process.

By employing the internal tin process instead of the bronze process mentioned above, the problem of a low molar ratio of Sn in the interior of the wire can be solved, and the volume of $Nb_3Sn$ can be increased. However, the conventional internal tin process has had a problem that large vacancies occur after Sn at the center diffused in the Cu matrix, and the mechanical properties of the wire are impaired.

Thus, Patent Literature 4 proposed by the present applicant proposes a precursor complex for a $Nb_3Sn$ superconducting wire whereby, in the production of an internal-tin-processed $Nb_3Sn$ superconducting wire, a dense alloy structure is obtained while vacancies generated after Sn at the center diffused in a Cu matrix are suppressed by using a CuZn alloy matrix, and a method for producing a $Nb_3Sn$ superconducting wire using the precursor complex. However, a precursor complex, whereby a $Nb_3Sn$ superconducting wire having characteristics further improved over those in the case where a CuZn alloy matrix is used is obtained, is desired.

CITATION LIST

Patent Literature

Patent Literature 1: JP S54-40438B
Patent Literature 2: JP 2013-206532A
Patent Literature 3: JP 2009-193856A
Patent Literature 4: JP 2015-185211A

SUMMARY OF INVENTION

Technical Problem

An issue to be solved by the present invention is to provide a method for producing a $Nb_3Sn$ superconducting wire whereby, in the production of an internal-tin-processed $Nb_3Sn$ superconducting wire, a dense alloy structure is obtained without the occurrence of large vacancies after Sn at the center diffused in a Cu matrix. Further, the present invention provides a precursor for a $Nb_3Sn$ superconducting wire suitable for use of this, i.e., of the method for producing a $Nb_3Sn$ superconducting wire.

Solution to Problem

Figure 1:
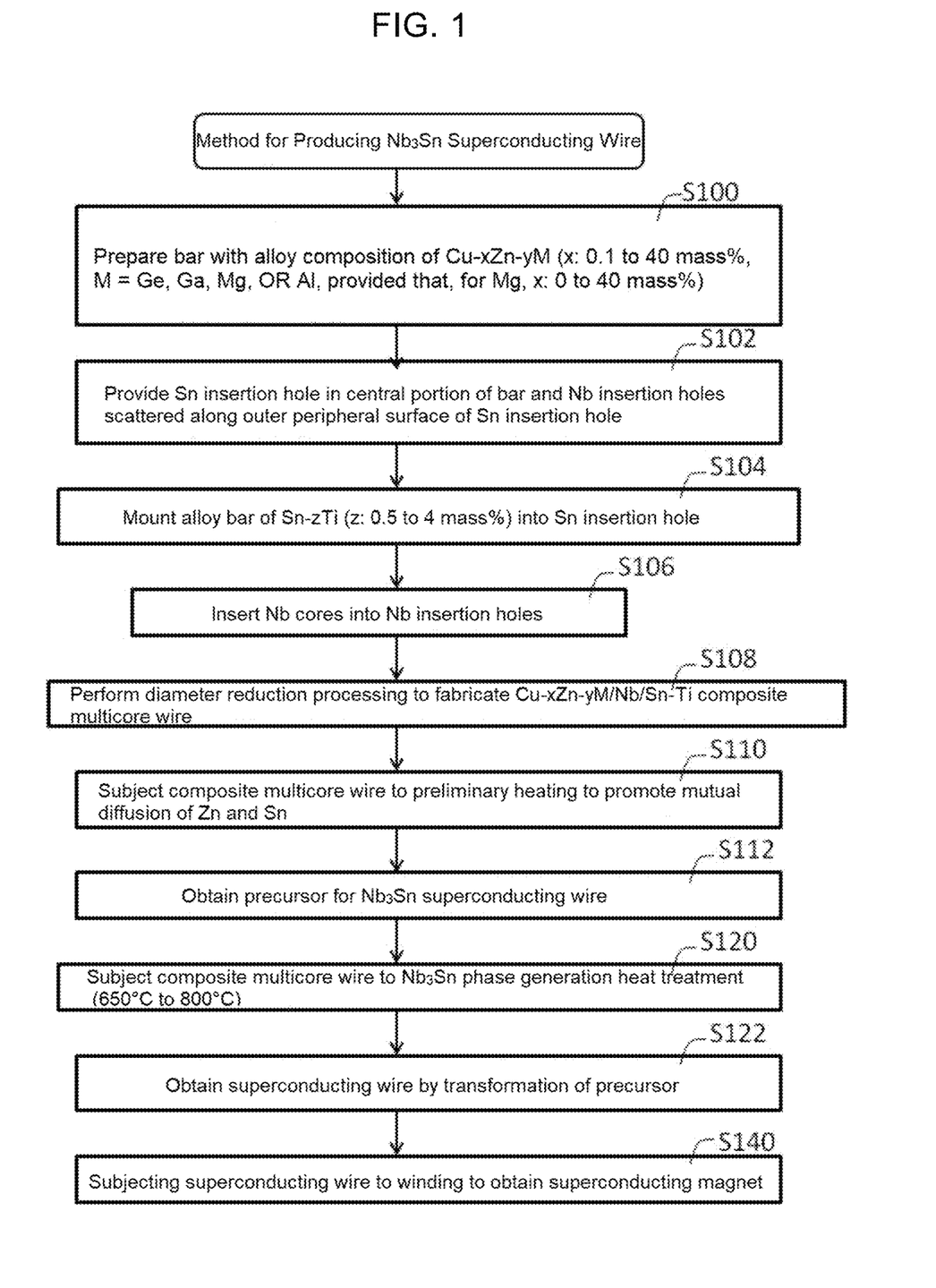
FIG. 1 is a flow chart describing a production process of an internal-tin-processed $Nb_3Sn$ wire according to an embodiment of the present invention.

A method for producing a $Nb_3Sn$ superconducting wire of the present invention includes, as illustrated in FIG. 1, for example: a step of providing a bar 10 in which an alloy composition is represented by Cu-xZn-yM (M=Ge, Ga, Mg, or Al), where composition ratios x and y mass % are as follows in accordance with a kind of a third element M, Cu-xZn-yGe (x: 0.1 to 40 mass %, y: 0.1 to 12 mass %),
Cu-xZn-yGa (x: 0.1 to 40 mass %, y: 0.1 to 21 mass %),
Cu-xZn-yMg (x: 0 to 40 mass %, y: 0.01 to 3 mass %),
or
Cu-xZn-yAl (x: 0.1 to 40 mass %, y: 0.01 to 0.85 mass %).

The method includes a step of providing the bar 10 that has a Sn insertion hole 12 provided in a central portion of the bar 10 with this alloy composition and that has a plurality of Nb insertion holes 14 provided discretely along an outer peripheral surface of the Sn insertion hole 12 (S100 and S102), a step of mounting, into the Sn insertion hole 12, an alloy bar with an alloy composition of Sn-zQ (z: 0.5 to 4 mass %, Q=Ti, Zr, or Hf), and inserting Nb cores into the Nb insertion holes 14 (S104 and S106), a step of subjecting the bar 10 to diameter reduction processing to fabricate a Cu-xZn-yM/Nb/Sn-zQ composite multicore wire with a prescribed outer diameter (S108), and a step of subjecting the composite multicore wire to $Nb_3Sn$ phase generation heat treatment at 650° C. to 800° C. (S120).

In the method for producing a $Nb_3Sn$ superconducting wire of the present invention, preferably, the composite multicore wire is subjected to preliminary heating to promote mutual diffusion of Zn and Sn, and then the composite multicore wire may be subjected to $Nb_3Sn$ phase generation heat treatment at 650° C. to 800° C. (S110 and S120).

In the method for producing a $Nb_3Sn$ superconducting wire of the present invention, preferably, in the step of fabricating the composite multicore wire, the Cu-xZn-yM/Nb/Sn-zQ composite multicore wire is separated into a Cu-xZn-yM/Nb complex and Sn-zQ, the Cu-xZn-yM/Nb complex is subjected to process annealing, and then the Cu-xZn-yM/Nb complex and the Sn-zQ are integrated to form a Cu-xZn-yM/Nb/Sn-zQ composite multicore wire.

Figure 2:
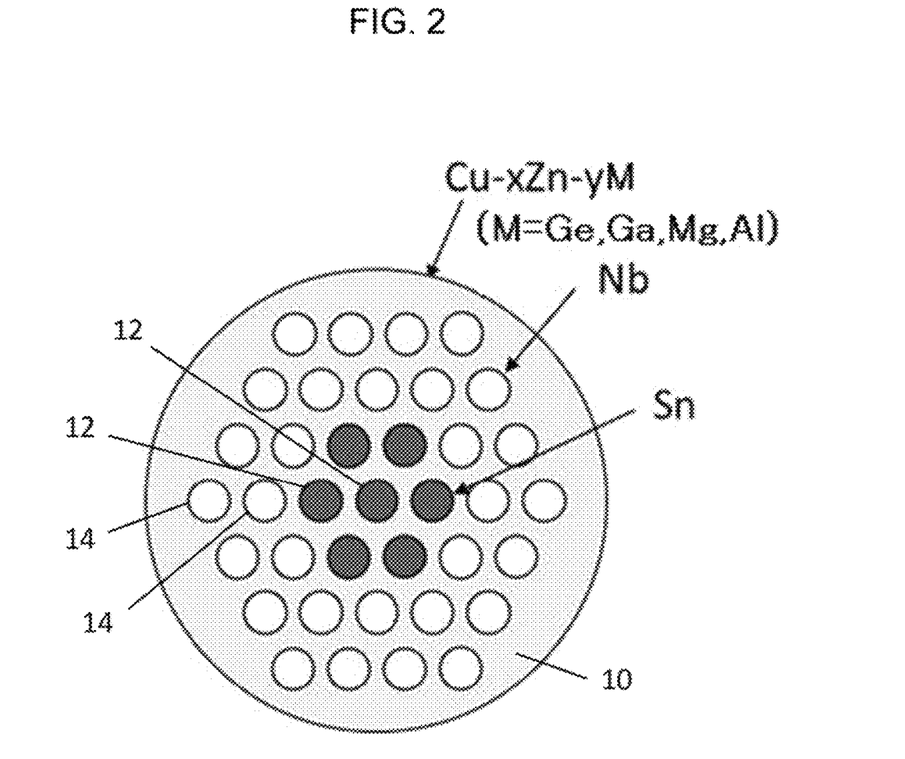
FIG. 2 shows an example of a cross-sectional structure of a Cu-xZn-yM/Nb/Sn—Ti composite precursor wire according to an embodiment of the present invention, in which Sn—Ti alloy bars and Nb cores are inserted in a bar.

A precursor for a $Nb_3Sn$ superconducting wire of the present invention includes, as illustrated in FIG. 2, for example, a bar 10 in which an alloy composition is represented by Cu-xZn-yM (M=Ge, Ga, Mg, or Al), where composition ratios x and y mass % are as follows in accordance with a kind of a third element M, Cu-xZn-yGe (x: 0.1 to 40 mass %, y: 0.1 to 12 mass %),
Cu-xZn-yGa (x: 0.1 to 40 mass %, y: 0.1 to 21 mass %),
Cu-xZn-yMg (x: 0 to 40 mass %, y: 0.01 to 3 mass %), or
Cu-xZn-yAl (x: 0.1 to 40 mass %, y: 0.01 to 0.85 mass %).

The precursor for a $Nb_3Sn$ superconducting wire includes the bar 10 having Sn insertion holes 12 provided in a central portion of the bar 10 with this alloy composition and a plurality of Nb insertion holes 14 provided discretely along an outer peripheral surface of the Sn insertion holes 12; alloy bar portions with an alloy composition of Sn-zQ (z: 0.5 to 4 mass %, Q=Ti, Zr, or Hf) mounted in the Sn insertion holes 12; and Nb core portions inserted in the Nb insertion holes 14.

In the Nb core portions, one or more elements selected from the group consisting of Ti, Hf, Zr, and Ta may be contained at 0 to 5 mass %. All these additive elements have substantially equal effects in improving the magnetic field characteristics of $Nb_3Sn$.

In the precursor for a $Nb_3Sn$ superconducting wire of the present invention, the volume ratio of the Nb core portions to the alloy bar portion is preferably 1.5 to 5 times.

In the precursor for a $Nb_3Sn$ superconducting wire of the present invention, the space factor of Nb in the Cu alloy matrix is preferably 5 to 80%. At less than 5%, the amount of $Nb_3Sn$ produced is small, and characteristics are poor; at more than 80%, the amount of the matrix is too small, and the production of a precursor wire is difficult.

A $Nb_3Sn$ superconducting wire of the present invention is made of the precursor for a $Nb_3Sn$ superconducting wire subjected to $Nb_3Sn$ phase generation heat treatment; the $Nb_3Sn$ layer having a thickness of 0.1 to 500 μm is formed when Sn is diffused in a Nb core, and part or all of Q (=Ti, Zr, or Hf) contained in the alloy bar portion is dissolved as solid solution; and the $Nb_3Sn$ superconducting wire has substantially no vacancies even after Sn contained in the alloy bar portion is diffused in the Cu matrix of the bar 10.

Advantageous Effects of Invention

By a method for producing a $Nb_3Sn$ superconducting wire of the present invention, a $Nb_3Sn$ superconducting wire can be produced that is abundant in functionality, such as, in addition to the promotion of production of a $Nb_3Sn$ layer, the mechanical strength of the superconducting filament (and an increase in interface resistance), an improvement in critical temperature (magnetic field), and the grain size reduction.

By a precursor for a $Nb_3Sn$ superconducting wire of the present invention, a precursor is obtained that can be turned into a $Nb_3Sn$ superconducting wire that is abundant in functionality, such as, in addition to the promotion of production of a $Nb_3Sn$ layer, the mechanical strength of the superconducting filament (and an increase in interface resistance), an improvement in critical temperature (magnetic field), and the grain size reduction.

In a $Nb_3Sn$ superconducting wire of the present invention, there are no or very few voids, which have been generated in production based on the conventional internal tin process, and therefore strain characteristics in the $Nb_3Sn$ superconducting wire are greatly improved.

DESCRIPTION OF EMBODIMENTS $Nb_3Sn$ (niobium 3 tin) is an intermetallic compound of niobium (Nb) and tin (Sn), and is industrially used as a type-II superconductor. This intermetallic compound is an A15 phase superconductor.

Here, the type-II superconductor is a superconductor made of niobium, vanadium, or an alloy compound composed of two or more metals, and is a superconductor that, as the strength of the magnetic field is increased, can maintain a state of zero electric resistance where superconducting part and normal conduction part coexist, when magnetic flux stay at the normal conduction parts such as internally distorted region or impurities. The type-II superconductor maintains zero resistance by the pinning effect.

The A15 phase is also known as a β-W-type intermetallic compound or a $Cr_3Si$ structure type; and has the chemical formula of $A_3B$ (A is a transition metal, and B is an element such as Si, Ga, Ge, or Sn), and is a series of intermetallic compounds having a peculiar structure. Most compounds of the A15 phase exhibit superconductivity with relatively high critical temperatures Tc (approximately 20 K), and remain superconductivity even in magnetic fields of several tens of teslas. The compound of the A15 phase has practical uses as a type-II superconductor.

In the present invention, the composition of an alloy used as the matrix is a Cu-xZn-yM (M=Ge, Ga, Mg, or Al) alloy, where the composition ratios x and y mass % are as follows in accordance with the kind of the third element M, Cu-xZn-yGe (x: 0.1 to 40 mass %, y: 0.1 to 12 mass %),
Cu-xZn-yGa (x: 0.1 to 40 mass %, y: 0.1 to 21 mass %),
Cu-xZn-yMg (x: 0 to 40 mass %, y: 0.01 to 3 mass %), or
Cu-xZn-yAl (x: 0.1 to 40 mass %, y: 0.01 to 0.85 mass %).

By using a Cu-xZn-yM alloy of the composition mentioned above, the present invention can provide a $Nb_3Sn$ superconducting wire that is abundant in functionality, such as, in addition to the promotion of production of a $Nb_3Sn$ layer, the mechanical strength of the superconducting filament (and an increase in interface resistance), the critical temperature (magnetic field), and the grain size reduction, and can provide a method for producing the $Nb_3Sn$ superconducting wire.

The reasons why the composition and the content amounts of components in the precursor for a $Nb_3Sn$ superconducting wire of the present invention and the $Nb_3Sn$ superconducting wire using the same of the present invention are limited as above will now be described. In the following description, "%" showing the content amount refers to mass %.

Zinc (Zn): By adding Zn, the effect of markedly promoting the production of a $Nb_3Sn$ layer can be obtained. The mass ratio of Zn in the Cu-xZn-yM alloy matrix is desirably 0.1 to 40 mass % for a (M=Ge, Ga, or Al) alloy. At less than 0.1 mass %, the effect of promoting the production of a $Nb_3Sn$ layer is small; at more than 40 mass %, a Cu—Zn compound is formed, and the processability of the precursor wire is significantly reduced.

The mass ratio of Zn in the Cu-xZn-yM alloy matrix is desirably 0 to 40 mass % for a (M=Mg) alloy. In the Cu-xZn-yMg alloy, the effect of promoting the production of a necessary $Nb_3Sn$ layer is obtained by the action of Mg added at the same time even when the amount of Zn added is 0 mass %.

Germanium (Ge): In the case where Ge is added to the Cu-xZn-yM alloy matrix, the mass ratio of Ge is desirably 0.1 to 12 mass %. At less than 0.1 mass %, the amount of a Ge compound formed around a $Nb_3Sn$ layer is too small, and the effect of improving the mechanical strength of the filament is small; at more than 12 mass %, a Cu—Ge compound is formed, and the processability of the precursor wire is significantly reduced. The mass ratio of Ge is more preferably 0.1 to 5 mass %.

By adding Ge to the Cu-xZn-yM alloy matrix, a Ge—Ti-based compound phase is formed around the superconducting filament, and this contributes to an improvement in the mechanical strength of the superconducting filament and allows an increase in filament interface resistance to be expected. The increase in interface resistance suppresses coupling currents between filaments, and therefore leads to a reduction in energy loss in alternating current uses.

Gallium (Ga): In the case where Ga is added to the Cu-xZn-yM alloy matrix, the mass ratio of Ga is desirably 0.1 to 21 mass %. At less than 0.1 mass %, the effect of improving the critical temperature of the $Nb_3Sn$ layer is small; at more than 21 mass %, a Cu—Ga compound is formed, and the processability of the precursor wire is significantly reduced. The mass ratio of Ga is more preferably 0.1 to 10 mass %. In the case of Ga addition, the effect of improving the critical temperature (magnetic field) is obtained.

Magnesium (Mg): In the case where Mg is added to the Cu-xZn-yM alloy matrix, the mass ratio of Mg is desirably 0.01 to 3 mass %. At less than 0.01 mass %, the effect of the grain size reduction of the $Nb_3Sn$ layer is small; at more than 3 mass %, a Cu—Mg compound is formed, and the processability of the precursor wire is significantly reduced. The mass ratio of Mg is more preferably 0.01 to 2 mass %. In Mg addition, the size reduction of grains is achieved, and thereby an improvement in strain characteristics and an improvement in critical current density (an improvement in pinning force, etc.) can be expected.

Aluminum (Al): In the case where Al is added to the Cu-xZn-yM alloy matrix, the mass ratio of Al is desirably 0.01 to 0.85 mass %. At less than 0.01 mass %, the effect of promoting the production of a $Nb_3Sn$ layer is small; at more than 0.85 mass %, a Cu—Al compound is formed, and the processability of the precursor wire is significantly reduced. The mass ratio of Al is more preferably 0.01 to 0.5 mass %. In Al addition, the effect of promoting the production of a $Nb_3Sn$ layer is seen.

Next, the present invention is described by referring to the drawings.

FIG. 1 is a flow chart describing a production process of an internal-tin-processed $Nb_3Sn$ wire, showing an embodiment of the present invention. FIG. 2 is an example of a cross-sectional structure of a Cu-xZn-yM/Nb/Sn—Ti composite precursor wire, showing an embodiment of the present invention.

In the precursor of the cross-sectional configuration shown in FIG. 2, a bar made of Cu-1Zn-5Ge with an outer diameter of 30 mm is prepared as a matrix 10. Next, a hole with an inner diameter of 2 mm is formed at the center of the matrix 10, and six holes are formed along a first outer periphery around the central hole; thus, Sn insertion holes 12 are formed. Further, twelve holes each with an inner diameter of 2 mm are provided discretely in an outer peripheral form along a second outer periphery of the Sn insertion holes 12, and eighteen holes each with an inner diameter of 2 mm are provided along a third outer periphery further on the outside of the second outer periphery; thus, Nb insertion holes 14 are formed. That is, there are thirty Nb insertion holes 14 in total.

The reason why Sn insertion holes 12 are provided in a central portion of the matrix 10 is that, when the precursor is processed into a $Nb_3Sn$ superconducting wire, the central portion takes on a smaller strain and is less likely to break than the peripheral portion even if the wire is bent. A complex is fabricated by inserting alloy bars of Sn-zQ (z: 0.5 to 4 mass %, Q=Ti, Zr, or Hf), herein alloy bars of Sn-2 mass % Ti, into the Sn insertion holes 12, and inserting Nb core portions into the Nb insertion holes 14.

Figure 3:
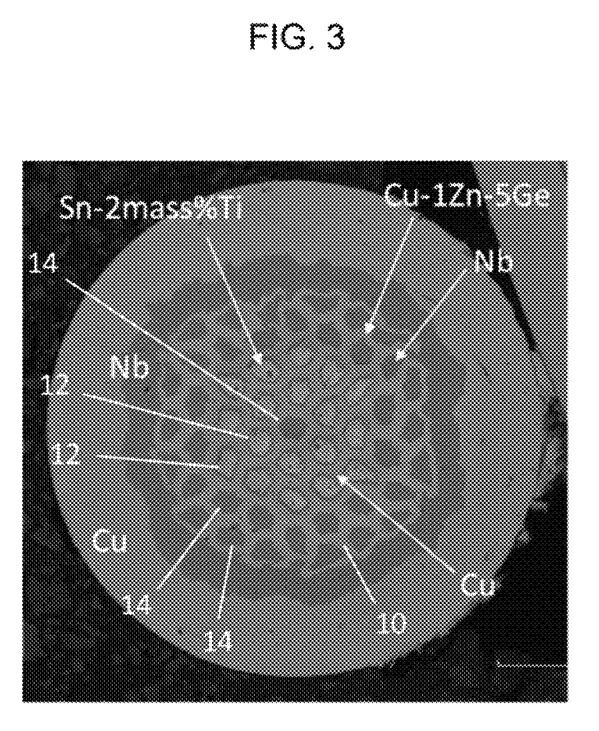
FIG. 3 is a cross-sectional photograph of a precursor wire produced using a Cu-1Zn-5Ge matrix according to an embodiment of the present invention.

The cross-sectional configuration of the precursor is not limited to FIG. 2; as shown in FIG. 3, one Nb insertion hole may be provided at the center of a bar. In this case, six holes are provided along a central portion of the bar, specifically along a first outer periphery around the central hole, and twelve holes are provided along a second outer periphery; thus, a total of eighteen Sn insertion holes 12 are formed. Further, eighteen holes are provided along a third outer periphery located on the outside of the Sn insertion holes 12, and further eighteen holes are provided in a fourth outer peripheral portion that is on the outside of the third outer periphery and on the inside of the outer peripheral surface of the bar made of Cu-1Zn-5Ge, which is the matrix; thus, Nb insertion holes 14 are formed. That is, there are 37 Nb insertion holes 14 in total.

Example 1

A precursor having the cross-sectional configuration shown in FIG. 3 was fabricated in accordance with the procedure mentioned below. First, a bar made of Cu-1Zn-5Ge with an outer diameter of 30 mm (provided that, in the present Example, copper was placed in a central portion in order to improve processability) was prepared as the matrix 10 (S100). Next, a hole with an inner diameter of 2 mm was formed in a central portion of the matrix 10 to form a Nb insertion hole. Next, a total of twenty holes were formed along a first outer periphery and a second outer periphery around the central hole, and Sn insertion holes 12 were formed. Further, a total of 36 Nb insertion holes 14 were provided between a third outer periphery located on the outer periphery of the Sn insertion holes 12 and a fourth outer periphery on the inside of the outer peripheral surface of the bar made of Cu-1Zn-5Ge, which was the matrix (S102). That is, there were 37 Nb insertion holes 14 in total.

Next, an alloy bar of Sn-2 mass % Ti with a diameter of a little less than 2 mm was inserted into the center of the Sn insertion hole 12 (S104). Subsequently, a Nb core with a diameter of a little less than 2 mm was inserted into each Nb insertion hole 14 located around the Sn insertion holes 12 (S106). Thereby, a complex was fabricated. The complex has alloy bar portions located in the Sn insertion holes 12 and Nb core portions located in the Nb insertion holes 14.

Next, the complex was subjected to diameter reduction processing, and a Cu-1Zn-5Ge/Nb/Sn—Ti composite multicore wire with an outer diameter of approximately 0.6 mm was fabricated (S108). The wire was subjected to preliminary heating of 650° C.×100 h in an Ar gas atmosphere (S110). Mutual diffusion of Cu, Sn, Zn, and M (Ge) is promoted by the preliminary heating. Further, a precursor for a $Nb_3Sn$ superconducting wire was obtained by the preliminary heating (S112).

Next, the precursor for a $Nb_3Sn$ superconducting wire was subjected to heat treatment of 750° C.×100 h in order to generate a $Nb_3Sn$ phase (S120). By this heat treatment, Sn diffuses to the matrix and further to the Nb core, and forms a $Nb_3Sn$ layer on the Nb core side. Zn remains in the matrix. The M elements exhibit respective distinctive diffusion behaviors; the behavior of Ge is as described below. Thus, the precursor transforms, and a superconducting wire is obtained (S122).

When the superconducting wire is subjected to winding, a superconducting magnet is obtained (S140).

Figure 4:
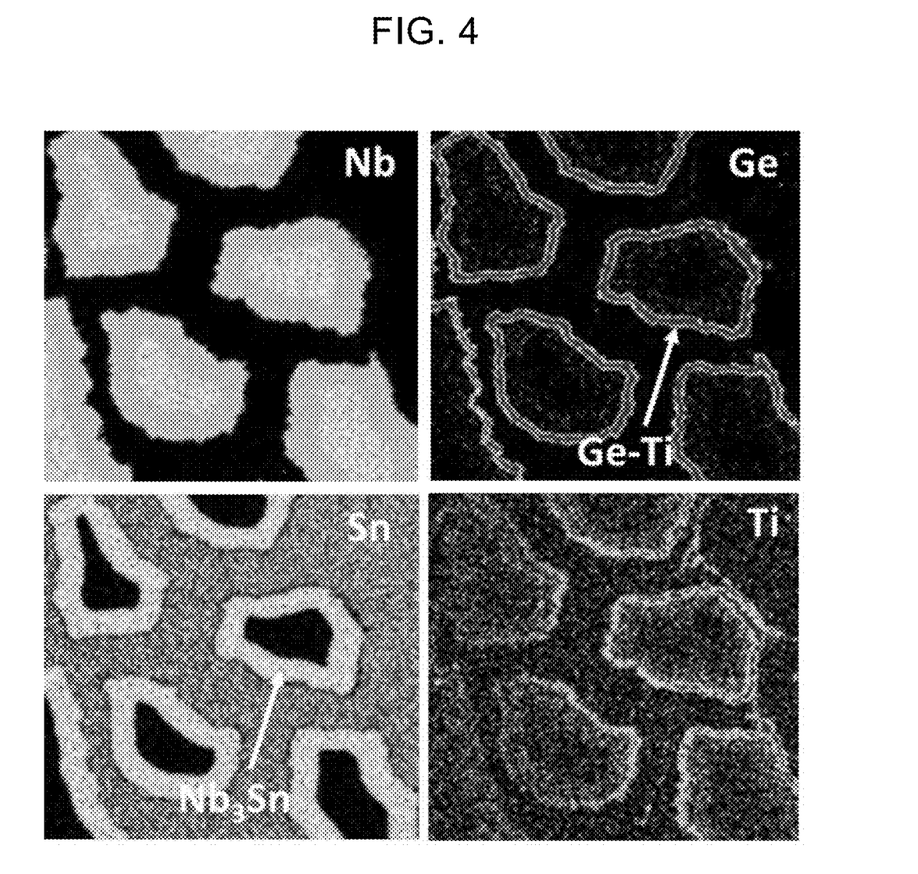
FIG. 4 is EPMA composition map analysis diagrams of a $Nb_3Sn$ wire produced using a Cu-1Zn-5Ge matrix according to an embodiment of the present invention.

FIG. 4 is EPMA composition map analysis diagrams of a $Nb_3Sn$ wire produced using a Cu-1Zn-5Ge matrix according to an embodiment of the present invention, and shows diagrams for Nb, Ge, Sn, and Ti. The electron probe microanalyzer (EPMA) is also called an electron beam microanalyzer. As shown in FIG. 4, a compound phase of Ge—Ti of approximately 2 μm is generated around a $Nb_3Sn$ layer formed on the outside of a Nb core, and a mechanical reinforcement effect is expected. It is expected that such a Ge—Ti compound phase also have an effect of increasing the interface resistance between the $Nb_3Sn$ layer and the matrix, and the $Nb_3Sn$ wire is expected to be suitable particularly for alternating current uses.

As shown in FIG. 4, it can be seen that the occurrence of large voids, which have been generated after Sn in the center of the wire is diffused in a conventional process, is suppressed, and a dense structure is obtained. The critical temperature of the wire was measured, and a value of approximately 18 K, which has been reported for $Nb_3Sn$, was shown.

Example 2

A composite precursor wire with a wire diameter of 0.814 mm similarly produced using a Cu-1Zn-10Ga alloy matrix was subjected to preliminary heating of 650° C.×100 h in an Ar gas atmosphere, and was then subjected to heat treatment of 750° C.×100 h in order to produce a $Nb_3Sn$ layer.

Figure 5:
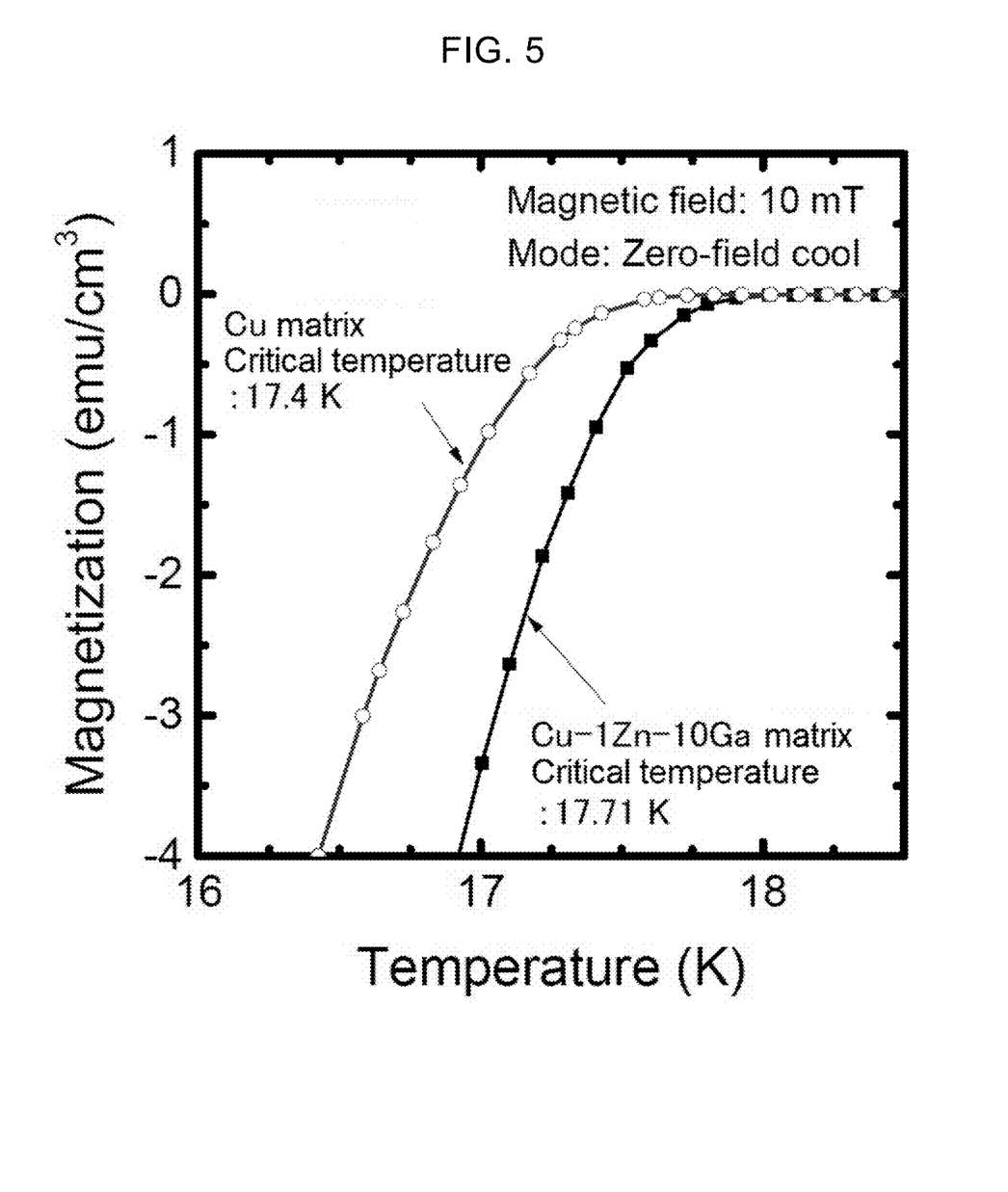
FIG. 5 is a comparison diagram of magnetization-temperature curves of $Nb_3Sn$ wires produced using a Cu-1Zn-10Ga matrix according to an embodiment of the present invention, and a Cu matrix.

The result of composition mapping has shown that, in the case of Ga, Ga diffuses to the $Nb_3Sn$ layer after the heat treatment. A magnetization-temperature curve of the present sample was measured by SQUID, and it has been found that, as shown in FIG. 5, the critical temperature at which a superconducting state is created was increased by 0.3 K as compared to the case where Ga was not added.

Example 3

A composite precursor wire similarly produced using a Cu-0.2Zn-1Mg alloy matrix was subjected to preliminary heating of 650° C.×100 h in an Ar gas atmosphere, and was then subjected to heat treatment of 800° C.×20 h in order to produce a $Nb_3Sn$ layer.

SEM observation was performed on a fracture surface of the wire, and it has been found that the average grain diameter of a Cu matrix in which Mg was not added was approximately 500 nm or more. On the other hand, in the matrix in which Mg was added, the grain coarsening was suppressed, and the average grain diameter was approximately 300 nm.

Example 4

A composite precursor wire similarly produced using a Cu-0.1Zn-0.5Al alloy matrix was subjected to preliminary heating of 650° C.×100 h in an Ar gas atmosphere, and was then subjected to heat treatment of 750° C.×100 h in order to produce a $Nb_3Sn$ layer. It has been found that the critical temperature was improved by 0.1 K as compared to that of a Cu matrix in which Al was not added.

Example 5

Figure 6:
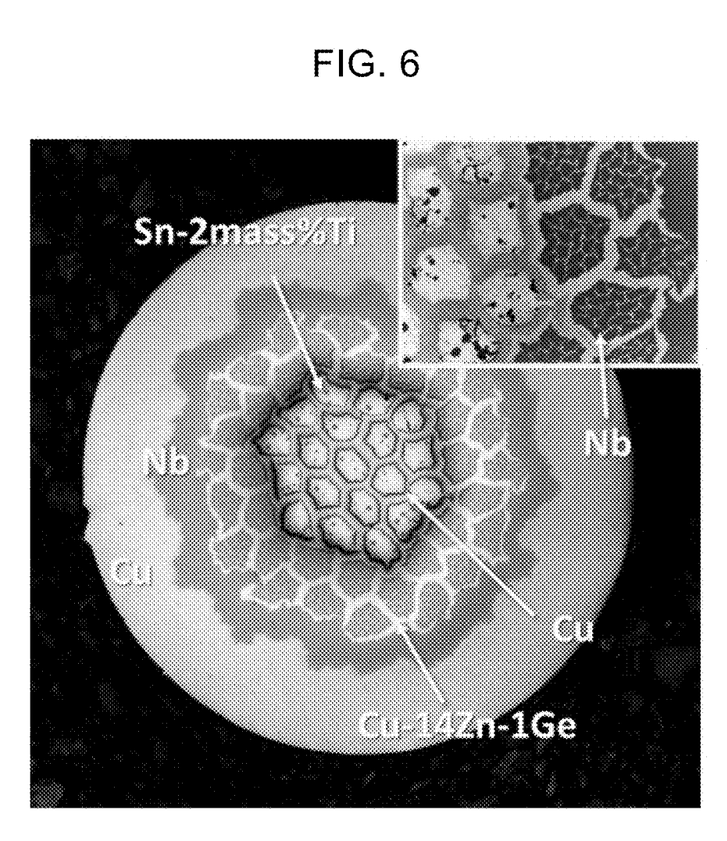
FIG. 6 is a cross-sectional photograph of an example of a precursor wire produced using a Cu-14Zn-1Ge matrix according to another embodiment of the present invention.

A sample was fabricated using an alloy in which the amount of Zn was set larger and the amount of Ge was set smaller than in Cu-1Zn-5Ge. That is, a composite multicore precursor wire with a wire diameter of 0.6 mm in which 684 Nb cores and 19 Sn-2 wt % Ti alloy cores were mounted in a matrix composed of Cu-14Zn-1Ge alloy and Cu (FIG. 6) was subjected to preliminary heating of 650° C.×100 h in an Ar gas atmosphere, and was then subjected to heat treatment of 750° C.×50 h in order to produce a $Nb_3Sn$ layer.

Figure 7:
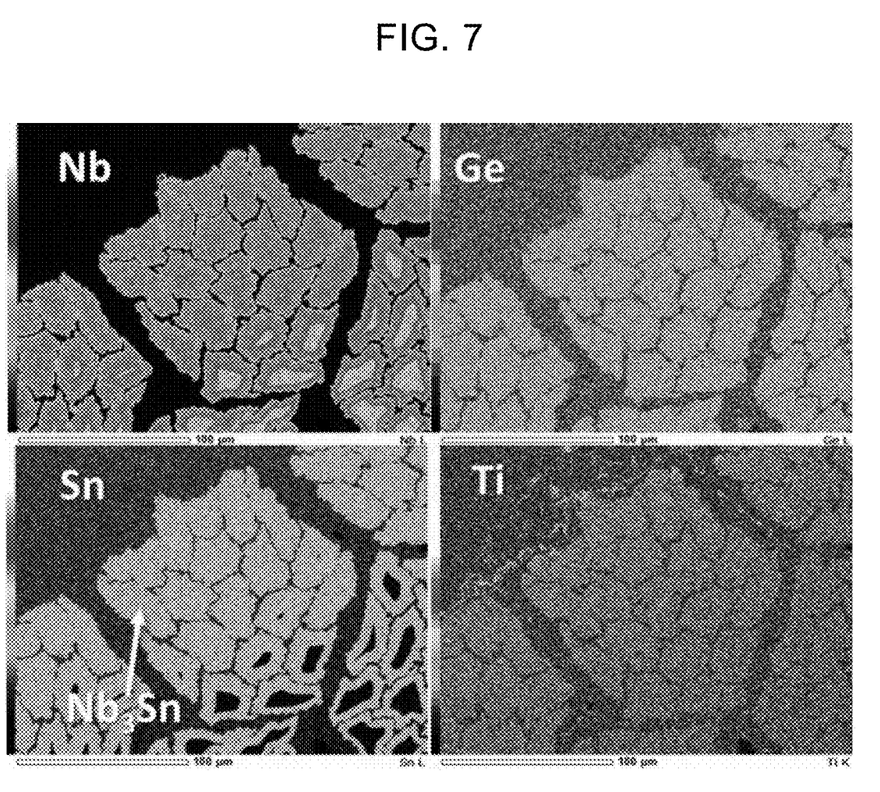
FIG. 7 is EDX composition map analysis diagrams of a $Nb_3Sn$ wire produced using a Cu-14Zn-1Ge matrix according to another embodiment of the present invention.
Figure 8:
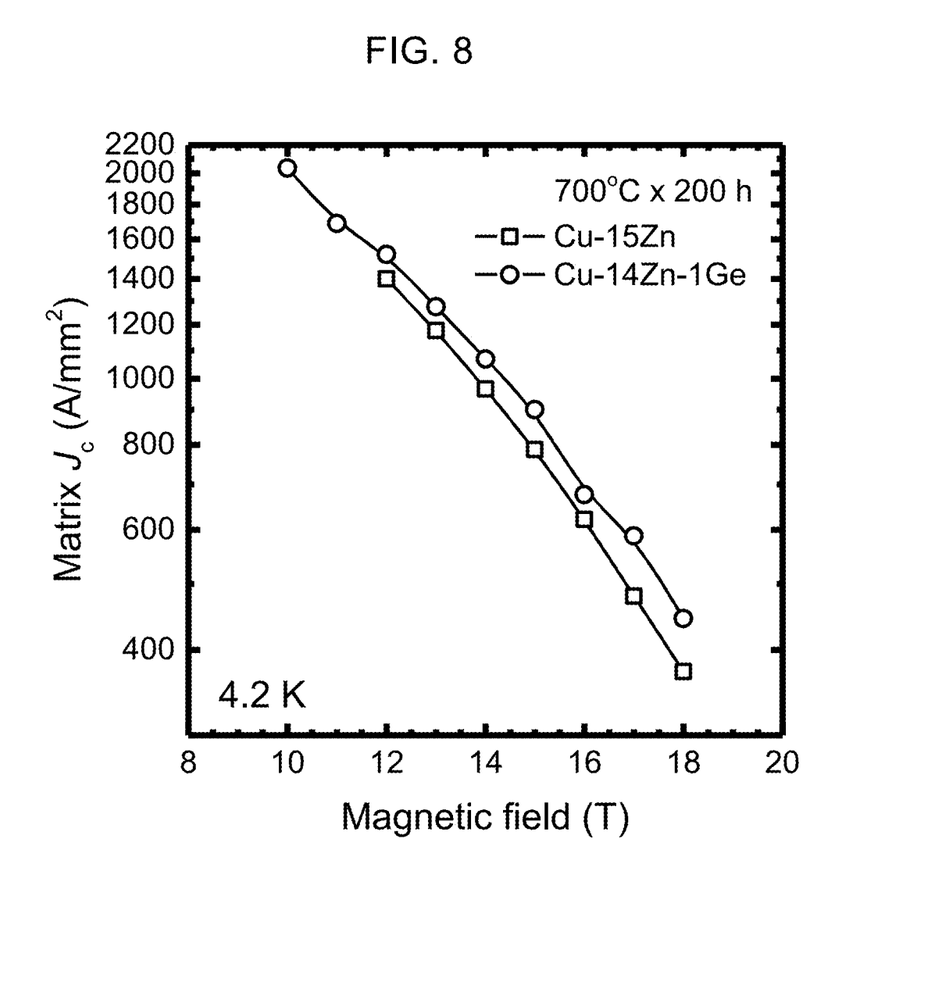
FIG. 8 is a critical current density characteristic diagram of a $Nb_3Sn$ wire produced using a Cu-14Zn-1Ge matrix according to another embodiment of the present invention.

Composition mapping by EDX was performed on the present sample, and it has been found that a $Nb_3Sn$ layer was produced in Nb cores, but a compound phase of Ge—Ti was not generated around the $Nb_3Sn$ layer and Ge was diffused up to the inside, unlike in the case of Cu-1Zn-5Ge (FIG. 7). The critical current was measured, and it has been found that characteristics were further improved as compared to a Cu—Zn matrix sample in which Ge was not added (FIG. 8). It is presumably due to improvement of the pinning force arising from the diffusion of Ge into the $Nb_3Sn$ layer.

The addition of Ge has mainly two effects, which are presumed to depend on the balance with the amount of Zn. In the case where the amount of Zn is large and the amount of Ge is small (for example, the fifth Example of the present invention), Ge diffuses into the $Nb_3Sn$ layer and improves the pinning force. In the case where the amount of Zn is small and the amount of Ge is large (for example, the first Example of the present invention), Ge forms a Ge—Ti compound phase around the $Nb_3Sn$ layer. This compound phase has not only a mechanical reinforcement effect but also an effect in increase in interface resistance.

Example 6

Next, in a sixth Example of the present invention, the composition of an alloy used as the matrix is Cu-wMg (w: 0.01 to 3 mass %), and does not contain Zn.

By using a Cu-wMg alloy of the composition mentioned above, the present invention can provide a $Nb_3Sn$ superconducting wire that is abundant in functionality, such as, in addition to the promotion of production of a $Nb_3Sn$ layer, the mechanical strength of the superconducting filament (and an increase in interface resistance), the critical temperature (magnetic field), and the grain size reduction, and a method for producing the same.

In the sixth Example of the present invention, a composite precursor wire produced using a Cu-1 Mg alloy matrix was subjected to preliminary heating of 650° C.×100 h in an Ar gas atmosphere, and was then subjected to heat treatment of 700° C.×200 h in order to produce a $Nb_3Sn$ layer.

Figure 9:
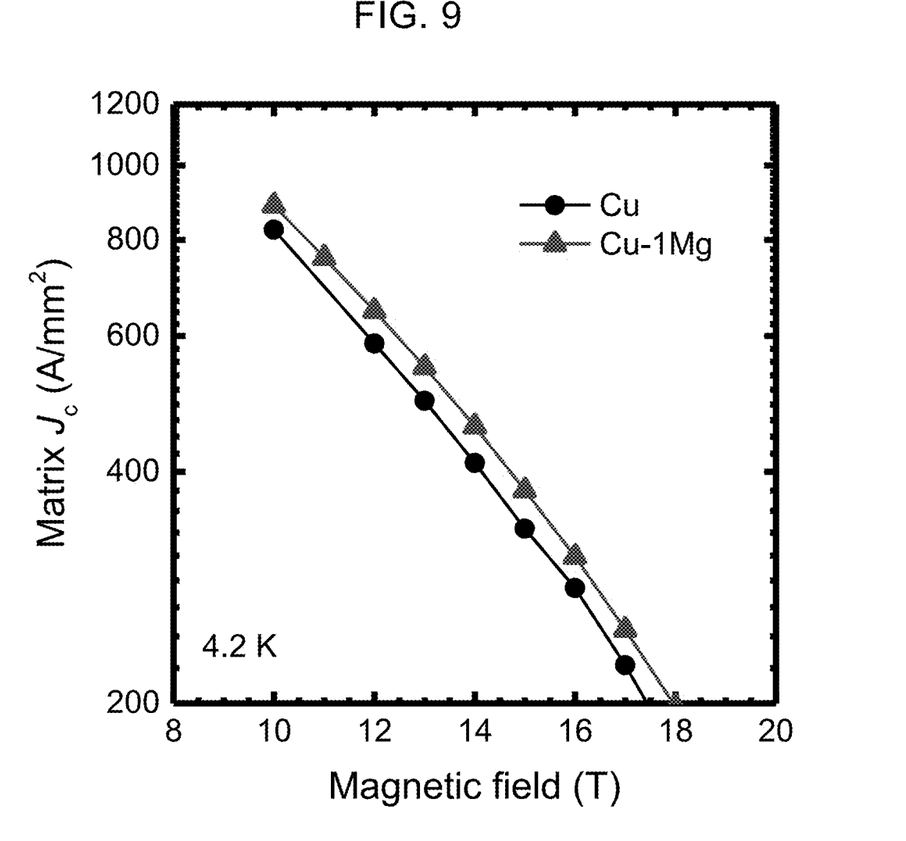
FIG. 9 is a critical current density characteristic diagram of a $Nb_3Sn$ wire produced using a Cu-1 Mg matrix according to another embodiment of the present invention.
Figure 10:
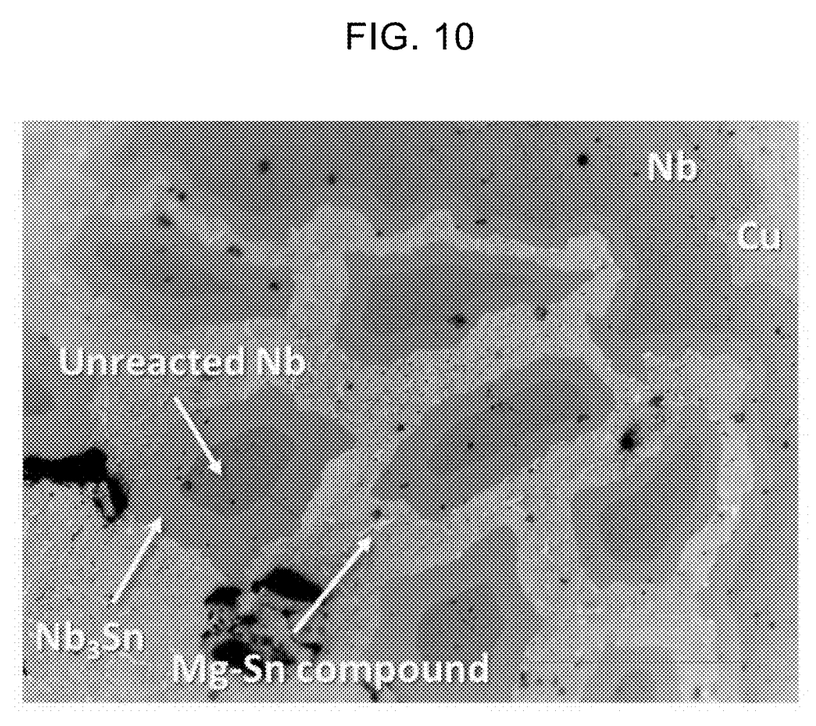
FIG. 10 is a cross-sectional photograph of a $Nb_3Sn$ wire produced using a Cu-1 Mg matrix according to another embodiment of the present invention.

SEM observation was performed on a fracture surface of the wire, and it was observed that each $Nb_3Sn$ grain has a diameter smaller than the average grain diameter for the sample with a Cu matrix in which Mg was not added. The critical current was measured, and it has been found that characteristics were improved as compared to a Cu matrix sample in which Mg was not added (FIG. 9). Interestingly, it has been found that Mg was bonded to Sn and was deposited as a compound in the matrix (FIG. 10). The existence of such a compound is presumed to be effective to improve the mechanical strength of the matrix.

The addition of Mg not only influences the characteristics of the $Nb_3Sn$ layer but also influences the structure of the matrix, and contributes to an improvement in mechanical characteristics, etc.

Effects of Examples 1 to 6 above are described in Table 1.

TABLE 1

| | Composition (mass %) | | | | | | Effects | | | |
|---|---|---|---|---|---|---|---|---|---|---|
| Example | Cu | Zn | Ge | Ga | Mg | Al | Tc improvement | Compound phase | Grain size reduction | Pinning force improvement |
| 1 | Balance | 1 | 5 | — | — | — | 0 | Present | Absent | |
| 5 | Balance | 14 | 1 | — | — | — | 0 | Absent | Absent | Present |
| 2 | Balance | 1 | — | 10 | — | — | +0.3K | Absent | Absent | |
| 6 | Balance | — | — | — | 1 | — | 0 | Absent | Present | Present |
| 3 | Balance | 0.2 | — | — | 1 | — | 0 | Absent | Present | Present |
| 4 | Balance | 0.1 | — | — | — | 0.5 | +0.1K | Absent | Absent | |
| Comparative Example | 100 | — | — | — | — | — | 0 | Absent | Absent | |

Production conditions for producing a $Nb_3Sn$ superconducting wire are determined as below on the basis of Examples above.

The cross-sectional area ratio of Sn—Ti to the Cu-xZn-yM matrix is desirably 5 to 30%. At less than 5%, the amount of $Nb_3Sn$ produced is small, and characteristics are poor; at more than 30%, a surplus Cu—Sn-based compound is produced, and mechanical properties are degraded.

The volume ratio of Nb to Sn—Ti is desirably 1.5 to 5 times. At less than 1.5 times, the amount of $Nb_3Sn$ produced is small, and high characteristics are not obtained; at more than 5 times, a large amount of unreacted Nb cores are left, and the critical current density of the wire is reduced.

The ratio of Ti atoms in the Sn—Ti core is desirably 0.5 to 4 mass %. Ti is incorporated into the $Nb_3Sn$ layer in the final heat treatment, and significantly improves the superconducting characteristics of the $Nb_3Sn$ layer; however, ratios of less than 0.5 mass % provide only small effect of improving the characteristics of the $Nb_3Sn$ wire, and ratios of more than 4 mass % rather reduce characteristics.

In the Sn—Ti core, Zr or Hf may be used in place of Ti. The ratio of Zr atoms in the Sn—Zr core is desirably 0.5 to 4 mass %. Zr is incorporated into the $Nb_3Sn$ layer in the final heat treatment, and significantly improves the superconducting characteristics of the $Nb_3Sn$ layer; however, ratios of less than 0.5 mass % provide only small effect of improving the characteristics of the $Nb_3Sn$ wire, and ratios of more than 4 mass % rather reduce characteristics.

The ratio of Hf atoms in the Sn—Hf core is desirably 0.5 to 4 mass %. Hf is incorporated into the $Nb_3Sn$ layer in the final heat treatment, and significantly improves the superconducting characteristics of the $Nb_3Sn$ layer; however, ratios of less than 0.5 mass % provide only small effect of improving the characteristics of the $Nb_3Sn$ wire, and ratios of more than 4 mass % rather reduce characteristics.

In Examples 1 to 6 above, process annealing was not performed in the fabrication of a Cu-xZn-yGe/Nb/Sn—Ti composite multicore wire because Sn—Ti easily reacts with other constituent materials. In this regard, a Cu-xZn-yM/Nb complex and Sn-zTi may be separated from each other, and process annealing may be performed on the Cu-xZn-yM/Nb complex in order to improve processability, as necessary. The temperature range of process annealing is preferably 300° C. to 800° C. After that, the Cu-xZn-yM/Nb complex and the Sn-zTi may be integrated to form a Cu-xZn-yM/Nb/Sn-zTi composite multicore wire; thus, the processability of the composite multicore wire is greatly improved.

The heat treatment for generating a $Nb_3Sn$ phase is desirably at 650° C. to 800° C. At less than 650° C., a $Nb_3Sn$ phase is not generated; at more than 800° C., the grain coarsening occurs, and high characteristics are not obtained.

It is desirable that, before performing $Nb_3Sn$ generation heat treatment at 650° C. to 800° C., preliminary heat treatment at 650° C. or less be performed to promote mutual diffusion of Zn and Sn, as shown in Examples.

It is sufficient if the precursor for a $Nb_3Sn$ superconducting wire of the present invention is just a complex of a Cu-xZn-yM alloy matrix, Nb or Nb alloy, and Sn or Sn alloy and be a structure in which the Cu-xZn-yM alloy matrix is in contact with Sn or Sn alloy. The precursor for a $Nb_3Sn$ superconducting wire of the present invention is allowed to have a cross-sectional structure of a multiple structure obtained by further bundling and wiredrawing the pieces of the composite wire shown in FIG. 2 of Example, or to have a cross-sectional structure in which large numbers of Nb cores and Sn—Ti cores are just distributed.

It is sufficient if the method for producing a $Nb_3Sn$ superconducting wire of the present invention employs a complex of a Cu-xZn-yM alloy matrix, Nb or Nb alloy, and Sn or Sn alloy with a structure in which the Cu-xZn-yM alloy matrix is in contact with Sn or Sn alloy. Thus, the method for producing a $Nb_3Sn$ superconducting wire of the present invention is not limited to the rod-in-tube method shown in Examples, and a complex of a Cu-xZn-yM alloy matrix, Nb or Nb alloy, and Sn or Sn alloy may be fabricated by, for example, the jelly roll method, the powder method, etc.

INDUSTRIAL APPLICABILITY

A $Nb_3Sn$ superconducting wire of the present invention is useful for strong magnetic field magnets to which large electromagnetic force is applied, and can be used for nuclear fusion and NMR apparatuses. Further, the $Nb_3Sn$ superconducting wire helps achieve a strong magnetic field of an MRI magnet, as an easy-to-use $Nb_3Sn$ wire.

REFERENCE SIGNS LIST

10 Bar
12 Sn insertion hole
14 Nb insertion hole

The invention claimed is:

1. A method for producing a $Nb_3Sn$ superconducting wire comprising:
    a step of providing a bar, wherein the bar has a Sn insertion hole provided in a central portion of the bar and a plurality of Nb insertion holes provided discretely along an outer peripheral surface of the Sn insertion hole, and wherein the bar has an alloy composition of Cu-xZn-yGa, wherein x=0.1 to 40 mass %, and y=10 to 21 mass %;
    a step of mounting an alloy bar into the Sn insertion hole and inserting Nb cores into the Nb insertion holes, wherein the alloy bar has an alloy composition of Sn-zQ, wherein z=0.5 to 4 mass %, and Q=Ti, Zr, or Hf;
    a step of subjecting the bar to diameter reduction processing to fabricate a Cu-xZn-yGa/Nb/Sn-zQ composite multicore wire; and
    a step of subjecting the composite multicore wire to $Nb_3Sn$ phase generation heat treatment at 650° C. to 800° C.

2. The method for producing a $Nb_3Sn$ superconducting wire according to claim 1, wherein, before the $Nb_3Sn$ phase generation heat treatment, the composite multicore wire is subjected to preliminary heating to promote mutual diffusion of Zn and Sn.

3. The method for producing a $Nb_3Sn$ superconducting wire according to claim 1, wherein, in the step of mounting the alloy bar into the Sn insertion hole and inserting the Nb cores into the Nb insertion holes, the Nb cores are inserted in the Nb insertion holes to obtain a Cu-xZn-yGa/Nb complex, the Cu-xZn-yGa/Nb complex is subjected to process annealing, and then the alloy bar is mounted into the Sn insertion hole.

4. A precursor for a $Nb_3Sn$ superconducting wire comprising:
    a bar, wherein the bar has a Sn insertion hole provided in a central portion of the bar and a plurality of Nb insertion holes provided discretely along an outer peripheral surface of the Sn insertion hole, and wherein the bar has an alloy composition of Cu-xZn-yGa, wherein x=0.1 to 40 mass %, and y=10 to 21 mass %;
    an alloy bar portion mounted in the Sn insertion hole, wherein the alloy bar portion has an alloy composition of Sn-zQ, wherein z=0.5 to 4 mass %, and Q=Ti, Zr, or Hf; and
    Nb core portions inserted in the Nb insertion holes.

5. The precursor for a $Nb_3Sn$ superconducting wire according to claim 4, wherein, in the Nb core portions, one or more elements selected from the group consisting of Ti, Hf, Zr, and Ta are contained at 0 to 5 mass %.

6. The precursor for a $Nb_3Sn$ superconducting wire according to claim 4, wherein a space factor of the Nb core portions inserted in the bar is 5 to 80%.

7. A $Nb_3Sn$ superconducting wire made from the precursor for a $Nb_3Sn$ superconducting wire according to claim 4 subjected to $Nb_3Sn$ phase generation heat treatment,
    wherein, an $Nb_3Sn$ layer having a thickness of 0.1 to 500 μm is formed when Sn is diffused in a Nb core, and part or all of Q, which is Ti, Zr, or Hf, contained in the alloy bar portion is dissolved as solid solution, and
    wherein, after Sn contained in the alloy bar portion is diffused in the Cu matrix of the bar, the wire has substantially no vacancies.

* * * * *